(12) United States Patent
Shamouilian et al.

(10) Patent No.: US 6,468,490 B1
(45) Date of Patent: Oct. 22, 2002

(54) ABATEMENT OF FLUORINE GAS FROM EFFLUENT

(75) Inventors: Shamouil Shamouilian, San Jose; Mehran Moalem; Tony S. Kaushal, both of Cupertino, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 12 days.

(21) Appl. No.: 09/607,918

(22) Filed: Jun. 29, 2000

(51) Int. Cl.$^7$ .............................................. B01D 53/68
(52) U.S. Cl. .................... 423/241; 423/240.5; 423/488; 423/483
(58) Field of Search .............................. 423/241, 240.9, 423/488, 483; 95/182

(56) References Cited

U.S. PATENT DOCUMENTS

| | | |
|---|---|---|
| 2,819,151 A | 1/1958 | Flemmert |
| 3,203,759 A | 8/1965 | Flemmert |
| 3,969,482 A | 7/1976 | Teller |
| 3,969,485 A | 7/1976 | Flemmert |
| 3,983,021 A | 9/1976 | Henis |
| 4,206,189 A | 6/1980 | Kosintsev et al. |
| 4,479,443 A | 10/1984 | Faldt et al. |
| 4,753,915 A | 6/1988 | Vogt et al. |
| 4,788,036 A | 11/1988 | Eiselstein et al. |
| 4,954,320 A | 9/1990 | Birmingham et al. |
| 4,966,611 A | 10/1990 | Schumacher et al. |
| 5,137,701 A | 8/1992 | Mundt |
| 5,151,116 A | 9/1992 | Scholz et al. |
| 5,176,897 A | 1/1993 | Lester |
| 5,207,836 A | 5/1993 | Chang |
| 5,417,934 A | 5/1995 | Smith et al. |
| 5,439,568 A | 8/1995 | Uchiyama |
| 5,510,066 A | 4/1996 | Fink et al. |
| 5,584,959 A | 12/1996 | Kimura et al. |
| 5,589,148 A | 12/1996 | Otsuka et al. |

(List continued on next page.)

FOREIGN PATENT DOCUMENTS

| | | |
|---|---|---|
| DE | 215706 | 11/1984 |
| DE | 4319118 | 12/1994 |
| JP | 51129868 | 11/1976 |
| JP | 5845718 | 3/1983 |
| JP | 39768 | 2/1991 |
| JP | 10192653 | 7/1998 |
| WO | 99/61132 | * 12/1999 |

OTHER PUBLICATIONS

PCT Communication dated Oct. 24, 2001, European Patent Office, P.B. 5818 Patentlaan 2, NL–22/80 HV Rijswijk.

*Primary Examiner*—Ngoc-Yen Nguyen
(74) *Attorney, Agent, or Firm*—Janah & Associates

(57) ABSTRACT

An effluent abatement system 200 that may be used to abate $F_2$ gas content of effluent exhausted from a process chamber 35, such as effluent from a CVD chamber cleaning process includes a catalytic reactor 250 to reduce the content of $F_2$ in the effluent 100. The system may further include a prescrubber 230 to add reactive gases to the effluent 100 and/or to treat the effluent 100 prior to treatment in the catalytic reactor 250. Alternatively reactive gases can be added to the effluent 100 by a gas source 220.

36 Claims, 4 Drawing Sheets

U.S. PATENT DOCUMENTS

| | | |
|---|---|---|
| 5,597,540 A | 1/1997 | Akita et al. |
| 5,643,545 A | 7/1997 | Chen et al. |
| 5,649,985 A | 7/1997 | Imamura |
| 5,663,476 A | 9/1997 | Cripe et al. |
| 5,720,444 A | 2/1998 | Wheeler et al. |
| 5,720,931 A | 2/1998 | Rossin et al. |
| 5,762,893 A | 6/1998 | Scholz et al. |
| 5,779,863 A | 7/1998 | Ha et al. |
| 5,785,741 A * | 7/1998 | Li et al. .................. 96/4 |
| 5,788,778 A | 8/1998 | Shang et al. |
| 5,817,284 A | 10/1998 | Nakano et al. |
| 5,843,239 A | 12/1998 | Shrotriya |
| 5,843,288 A | 12/1998 | Yamamoto |
| 5,858,065 A | 1/1999 | Li et al. |
| 5,865,879 A | 2/1999 | Lee |
| 5,914,091 A | 6/1999 | Holst et al. |
| 5,935,540 A * | 8/1999 | Otsuka et al. .............. 423/241 |
| 5,955,037 A | 9/1999 | Holst et al. |
| 6,009,827 A | 1/2000 | Robles et al. |
| 6,013,584 A | 1/2000 | M'saad et al. |
| 6,030,591 A * | 2/2000 | Tom et al. ............... 423/240.5 |
| 6,187,072 B1 | 2/2001 | Cheung et al. |

* cited by examiner

ABATEMENT OF FLUORINE GAS FROM EFFLUENT

BACKGROUND

The present invention is related to an apparatus and method for reducing a hazardous gas content of an effluent from a process chamber.

Fluorocarbon, chlorofluorocarbons, hydrocarbon, and other fluorine containing gases are used in, or formed as a byproduct during, the manufacture of active and passive electronic circuitry in process chambers. These gases are toxic to humans and hazardous to the environment. In addition, they may also strongly absorb infrared radiation and have high global warming potentials. Especially notorious are persistent fluorinated compounds or perfluorocompounds (PFCs) which are long-lived, chemically stable compounds that have lifetimes often exceeding thousands of years. Some examples of PFCs are carbon tetrafluoride ($CF_4$), hexafluoroethane ($C_2F_6$), perfluorocyclobutane ($C_4F_8$), difluoromethane ($CH_2F_2$), perfluorocyclobutene ($C_4F_6$), perafluoropropane ($C_3F_8$), trifluoromethane ($CHF_3$), sulfur hexafluoride ($SF_6$), nitrogen trifluoride ($NF_3$), carbonyl fluoride ($COF_2$) and the like. For example, $CF_4$ has a lifetime in the environment of about 50,000 years and can contribute to global warming for up to 6.5 million years.

Another hazardous gas is molecular fluorine, $F_2$. Extended exposure to as little as 1 ppm of $F_2$ can be hazardous, and $F_2$ is difficult to breakdown or reduce to non-toxic forms. Previously, effluents containing $F_2$ have been exhausted through exhaust stacks that are sufficiently tall that the concentration of $F_2$ in the air that descends to the ground is below regulatory levels. However, this technique is less than ideal from an environmental standpoint, and also undesirable from a manufacturing standpoint in that the volume of fluorinated gas processes that generate $F_2$ is limited by the height of the exhaust stack. Thus, it is desirable to have an apparatus or method that can reduce the hazardous gas content of effluents, especially effluents containing $F_2$, that may be released from process chambers.

One conventional $F_2$ abatement system uses a hydrogen burn box to reduce $F_2$. However, this system has several disadvantages. For example, a high temperature (generally above 850° C.) is necessary for the conversion of $F_2$ to HF in the presence of $H_2$. The heated HF is highly corrosive and hazardous, making its handling costly and dangerous. Additionally, the use of $H_2$ supply lines in a fabrication plant raises fire concerns that further add to the costs and danger of the system.

$F_2$ containing effluents are generated in numerous substrate fabrication processes, as well as in other processes. For example, process gases containing $F_2$, or that form $F_2$ as a byproduct of the process, are used in the etching of layers on substrates, such as oxide, metal and dielectric layers; during chemical vapor deposition processes; and to clean etchant or deposition residue in process chambers. These hazardous compounds may be exhausted from the chamber in the effluent gas stream.

It is desirable to minimize the introduction of such harmful gases and byproducts into the environment. There is also a need to minimize the harmful content of the effluent gas released into the atmosphere in an efficient and inexpensive manner. There is a further need to reduce $F_2$ emissions to the lowest possible levels especially for industries which widely use $F_2$ or $F_2$ producing gases, even though such use is a relatively small component of the overall consumption or release of $F_2$ in the world.

SUMMARY

The present invention is useful for reducing a content of hazardous gases, such as $F_2$, in an effluent gas that results from processing of substrates. By hazardous gas it is meant any toxic, harmful or undesirable gas, including but not limited to $F_2$, PFCs, chlorofluorocarbons (CFCs), hydrocarbons, other fluorine containing gases, and other undesirable gases.

In one aspect of the invention, a method of forming and treating an effluent gas from a process chamber comprises introducing a process gas into the process chamber before, during, or after processing a substrate in the process chamber, and forming an effluent gas comprising $F_2$ gas, and passing the effluent gas over a catalyst and thereby reducing the content of the $F_2$ gas in the effluent gas.

In another aspect of the invention, a method of forming and treating an effluent gas from a process chamber comprises introducing a process gas into the process chamber before, during, or after processing a substrate in the process chamber, and forming an effluent gas comprising $F_2$ gas, and introducing an additive into the effluent gas the additive comprising hydrogen species and oxygen species and thereby reducing the content of the $F_2$ gas in the effluent.

In another aspect of the invention, a method of forming and treating an effluent gas from a process chamber comprising introducing a process gas into the process chamber before, during, or after processing a substrate in the process chamber and forming an effluent gas comprising $F_2$ gas, heating the effluent gas and passing the effluent gas over a catalyst, thereby reducing the content of the $F_2$ gas in the effluent.

In another aspect of the invention, a method of cleaning a process chamber comprises introducing a cleaning gas into the process chamber and forming an effluent gas containing $F_2$ and passing the effluent gas over a catalyst, thereby reducing the content of the $F_2$ gas in the effluent.

In another aspect of the invention, a substrate processing apparatus comprises a source of process gas, a process chamber capable of performing a process with the process gas and forming an effluent gas containing $F_2$ and a catalytic reactor adapted to treat the effluent gas to reduce the $F_2$ content thereof.

In another aspect of the invention, a substrate processing apparatus comprises a process chamber capable of performing a process with process gas and forming an effluent containing $F_2$ and an additive source capable of introducing an additive into the effluent gas to reduce the $F_2$ content of the effluent, the additive comprising hydrogen species and oxygen species.

DRAWINGS

These features, aspects, and advantages of the present invention will become better understood with regard to the following description, appended claims, and accompanying drawings which illustrate exemplary features of the invention. However, it is to be understood that each of the features can be used in the invention in general, not merely in the context of the particular drawings, and the invention includes any combination of these features, where:

DESCRIPTION

The present invention relates to a gas treatment apparatus for use with a process chamber and a method of abating a hazardous gas content of effluent from the process chamber. The description and accompanying drawings represent illustrative embodiments of the invention and are not intended to limit the invention.

Figure 1:
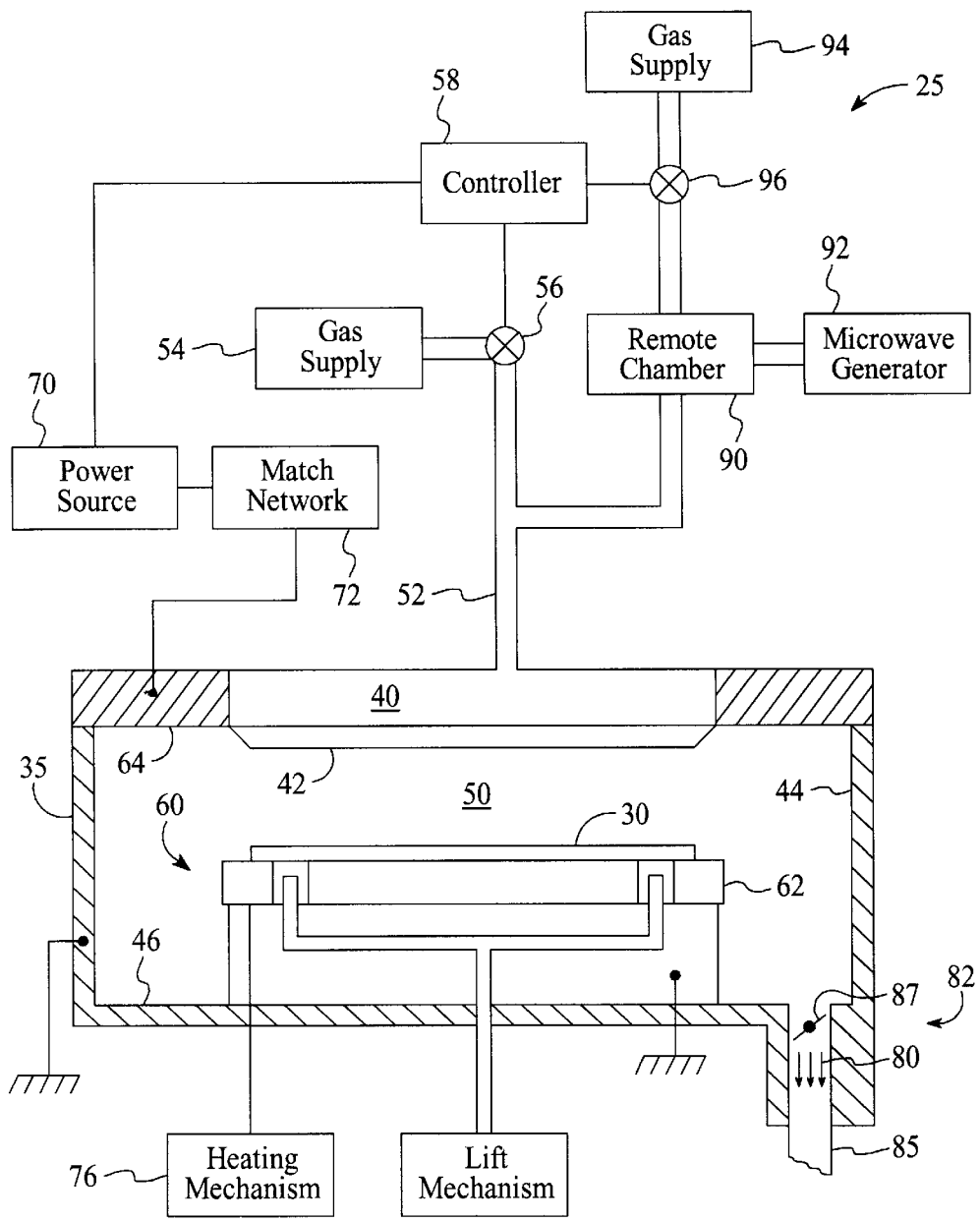
FIG. 1 is a schematic sectional side view of an exemplary substrate processing apparatus which produces effluent containing hazardous gases.

An exemplary substrate processing apparatus 25 for processing a substrate 30, as illustrated in FIG. 1, comprises a chamber 35 such as for example, an chemical vapor deposition (CVD) chamber, such as an SACVD chamber or an HDP CVD chamber, both of which are commercially available from Applied Materials Inc., Santa Clara, Calif., and generally described in commonly assigned U.S. Pat. No. 5,207,836 to Chang; U.S. Pat. No. 5,788,778 to Shang et al.; U.S. Pat. No. 5,843,239 to Shrotriya; U.S. Pat. No. 6,009,827 to Robles et al.; and U.S. Pat. No. 6,013,584 to M'Saad, all of which are incorporated herein by reference in their entireties. Such chambers can be used in a multi-chamber integrated process system as for example, described in U.S. Pat. No. 4,951,601 to Maydan, et al., which is also incorporated herein by reference in its entirety. The particular version of the chamber 35 shown herein, is suitable for processing of substrates 30, such as semiconductor wafers, for example silicon or gallium arsenide wafers or glass or ceramic substrates. The version is provided only to illustrate the invention, and should not be used to limit the scope of the invention.

The chamber 35 may be designed, for example, to deposit a silicon-containing layer, such as polysilicon, silicon nitride, silicon oxide, or metal silicide, or for depositing a metal layer or a metal-containing layer or any other type of layer on the substrate 30. As shown in FIG. 1, the CVD system includes a deposition chamber 35. Inside the chamber 35 is a gas distributor 40 for introducing process gas into the system. In the version shown in FIG. 1, the gas distributor 40 is a manifold or showerhead 42. Alternatively, gas inlets extending from the walls 44 or floor 46 of the chamber 35 may be provided. The gas distribution system 40 distributes process gas into a process zone 50 in proximity to the substrate 30. Process gas is delivered to the chamber 35 by supply line 52 from a process gas supply 54 when a gas flow valve 56 is opened under the control of a process controller 58, for example a computer control system.

A support 60 in the chamber 35 supports the substrate 30 thereon. A support electrode 62 may be provided within the support 60. The electrode 62 may be capacitively coupled with an upper electrode 64 above the substrate 30 to energize the process gas in the process zone 50 to form a plasma. In the version shown in FIG. 1, the upper electrode 64 is the ceiling of the chamber 35. A power supply 70 supplies power to the upper electrode 64 through a match network 72 and the support electrode 62 is grounded, or vice versa. Typically, RF power is supplied to the electrodes 62, 64. The support 60 may include a heating mechanism 76 which may comprise a resistive heater or a heat transfer gas that circulates heat transfer gas in proximity to the substrate 30. The support 60 may optionally comprise a mechanical or electrostatic chuck (not shown) having a surface adapted to receive the substrate 30. The surface may have grooves in which a heat transfer gas, such as helium, is held to control the temperature of the substrate 30.

During processing, the chamber 35 is evacuated to a low pressure, and a substrate 30 is transferred to the process zone 50 of the chamber 35 from a load lock transfer chamber (not shown) maintained at vacuum. Process gas is introduced into the chamber 35 through the gas supply 54 and gas distributer 40. The gas in the chamber 35 is typically maintained at a low pressure. A plasma is formed in the process zone 50 from the gas. In the chamber 35, the plasma is capacitively generated by applying an RF voltage to the electrode 64. Alternatively, an RF current may be applied to an inductor coil (not shown) to inductively couple energy into the chamber 35 to generate the plasma in the plasma zone 35. The frequency of the RF current applied to the electrode 64 or to the inductor coil (not shown) is typically from about 50 KHz to about 60 MHz, and more typically about 13.56 MHz. In another version, the capacitively generated plasma can also be enhanced by electron cyclotron resonance in a magnetically enhanced reactor in which a magnetic field generator, such as a permanent magnet or electromagnetic coils, that provide a magnetic field that may increase the density and uniformity of the plasma in the process zone 50.

Effluent 80 comprising process gas and process byproducts is exhausted from the chamber 35 through an exhaust system 82 capable of achieving a minimum pressure of about $10^{-3}$ mTorr in the chamber 35. The exhaust system 82 comprises an exhaust tube 85 that leads to one or a plurality of pumps, such as roughing and high vacuum pumps, that evacuate the gas in the chamber 35. A throttle valve 87 is provided in the exhaust tube 85 for controlling the pressure of the gas in the chamber 35. Also, an optical endpoint measurement technique is often used to determine completion of the etching process by measuring a change in light emission intensity of a gas species in the chamber 35 or measuring the intensity of light reflected from a layer being processed on the substrate 30.

During operation of the chamber 35 in a typical substrate process, a substrate 30 is placed on the support 60 in the process chamber 35, and a process gas comprising reactive gas is introduced into the process zone 50 through the process gas distributor 40. For example, an insulator or dielectric material such as, for example, $SiO_2$ or $Si_3N_4$, may be formed in a chemical vapor deposition (CVD) process using a process gas comprising one or more of $SiH_4$, $SiClH_2$, $CO_2$, $H_2$, $N_2O$, $Si(OC_2H_5)_4$, $NH_3$ and $N_2$. Additionally or alternatively, a metal-containing material which may comprise an elemental metal, a metal compound or a metal alloy, may be formed in the deposition chamber. For example, a tungsten-containing material may be deposited using a process gas comprising one or more of $WF_6$, $H_2$, and $SiH_4$; a molybdenum-containing material may be formed using, for example, a process gas comprising $MoCl_5$ and $H_2$ or equivalents; or an aluminum-containing material may be formed using, for example, $AlCl_3$ or $Al(CH_3)_3$ mixed with Ar or $H_2$ or both. The process gas may be energized in the process chamber 35 as described above, or alternatively may be energized in a remote chamber to, for example, process the substrate 30 in an energized plasma gas or a microwave energized gas. The energized reactive gas decomposes and deposits material onto the surface of the substrate 30. During and after processing, an effluent gas stream 100 of spent process gas and gaseous byproducts is exhausted from the process chamber 35.

Although the deposition process is designed to preferentially deposit material onto the substrate 30, material is also deposited onto the surfaces in the chamber 35. To clean the chamber 35 an in situ dry clean process may be periodically performed to clean or etch away the deposition residue from these surfaces. In one version, this cleaning process is carried out by remotely activating or energizing a cleaning gas in a remote chamber 90. A microwave generator 92, as described in U.S. Pat. No. 5,788,778, activates the cleaning gas which is delivered to the remote chamber 90 from a cleaning gas supply 94 when a valve 96 is opened under the control of controller 58. Alternatively, the cleaning gas could be energized inductively or capacitively or could be energized within the process chamber 35. The activated cleaning gas is delivered to the chamber 35 through the gas distributer 40 to clean or etch away the deposition residue in the chamber 35. A flow restrictor may be provided to allow a pressure differential to be provided between the process chamber 35 and the remote chamber 90.

In one version, the cleaning gas may comprise $NF_3$ at a flow of from about 1 to about 2 liters/minute. It is believed that the $NF_3$ breaks down in the remote chamber 90 (or in the process chamber if activated therein) to provide fluorine radicals that etch the silicon containing residues in the chamber 35. A significant percentage, approximately 90% or more of the fluorine, however, combines to form $F_2$ gas that is exhausted in an $F_2$ containing effluent 100. Effluent 100 is compositionally quite different that effluent 80 which is composed primarily of spent process gas and process byproducts. $F_2$ containing effluent 100, on the other hand, contains a significant percentage of $F_2$. For example, depending on the process conditions, the $F_2$ concentration in effluent 100 can be more than about 90%. Other processes and/or process conditions can produce effluents 100 having more than about 50% $F_2$, and others can produce effluents 100 having more than about 10% $F_2$. Alternatively, the $F_2$ may be generated when using process gas comprising other fluorine-containing gases, such as $CF_4$, $C_2F_6$, $C_3F_8$, $CHF_3$, $SF_6$, $COF_2$, $CH_3F$, $C_{CH_2}F_2$, $C_4F_6$ and the like. Furthermore, the $F_2$ effluent may be generated in a process chamber 35 capable of performing other substrate fabrication processes, such as etching or post etch treatment processes. The effluent may be formed either before, during, or after processing of a substrate. In one version, the effluent is formed after the processing of a substrate or a set of substrates during a chamber cleaning process.

It is desirable to reduce the amounts of $F_2$ present in the effluent 100 before the effluent 100 is exhausted. It has been discovered that passing the effluent 100 over a catalyst reduces the $F_2$-content of the effluent 100. The catalytic abatement may be conducted in the presence of an additive. In one version, the additive comprises hydrogen species and oxygen species, such as, for example, $H_2O$, $H_2O_2$, alcohols, hydroxyl containing gases, $H_2$ and $O_2$, and the like. In the presence of a catalyst, the water and $F_2$ convert the easily scrubbable and/or exhaustible HF and oxygen. It is believed that the one reaction is:

$$2F_2 + 2H_2O + catalyst \rightarrow 4HF + O_2$$

The $O_2$ may be exhausted, and the HF may be easily disposed of by dissolving it in water. Thus, it has been discovered that $F_2$ containing effluent 100 may be abated with an additive comprising hydrogen species and oxygen species.

That the addition of an additive, such as water, to effluent containing $F_2$ provides abatement of the effluent 100 is unexpected. Typically, water, or other oxygen species containing additive, contact with $F_2$ gas is specifically avoided because water reacts with the $F_2$ to form $OF_2$ which is an undesirable gas that needs to be reduced to concentrations less than 50 ppb before it can be released into the environment. However, it has been unexpectedly discovered that in the presence of the catalyst, the $OF_2$ formation is replaced by the HF and $O_2$ formation.

Figure 2:
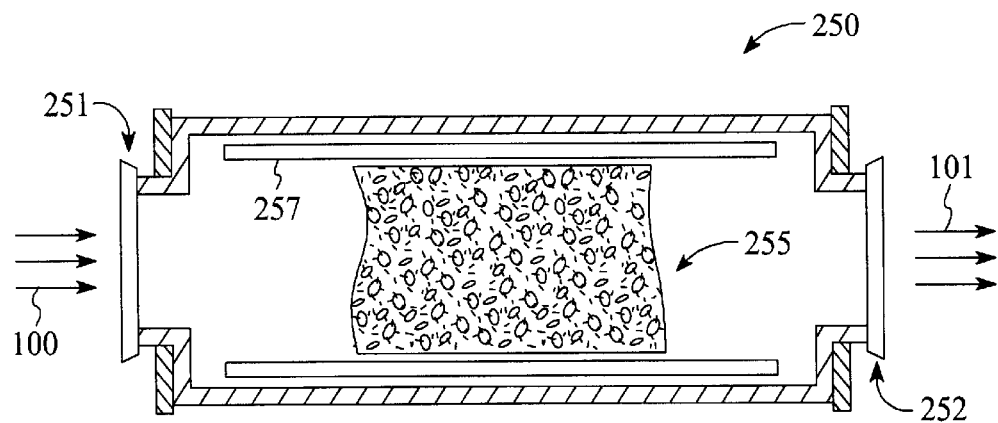
FIG. 2 is a schematic sectional side view of an exemplary catalytic reactor for use with a version of an abatement system.

In one version, the present catalyst may be housed in a catalytic reactor 250 through which the $F_2$ containing effluent 100 with additive gas is passed, an example of which is shown in FIG. 2. A vacuum pump draws the effluent 100 through the catalytic reactor 250, and optionally, flow controllers such as throttle valves may be used to regulate the flow of effluent through the catalytic reactor 250. In addition, the effluent gas 100 may be mixed upstream with a reactant such as an additive gas or liquid, and the mixture of gases passed through the catalytic reactor 250 through the inlet 251 and out of the outlet 252 to provide abated gas 101 exiting the catalytic reactor that may be exhausted to the atmosphere or easily treated for safe exhaustion.

The catalytic reactor 250 may comprise a catalytic surface 257 that catalyzes a reaction for reducing the hazardous gas content in the effluent. The catalytic surface 257 may be in the form of a structure made from catalytic material or supporting a finely divided catalyst, a bed of foam or pellets, or a coating on a wall or component of the catalytic reactor 250. For example, the catalytic surfaces 257 may comprise surfaces of a support structure comprising a honeycomb member with the catalyst embedded therein to form a high surface area member 255 over and through which the effluent 100 passes as it flows from the inlet 251 to the outlet 252. The catalytic surfaces 257 may be on, for example, a structure comprising a ceramic material, such as cordierite, $Al_2O_3$, alumina-silica, mullite, silicon carbide, silicon nitride, zeolite, and their equivalents; or may comprise a coating of materials, such as $ZrO_2$, $Al_2O_3$, $TiO_2$ or combinations of these and other oxides. The catalytic surfaces 257 may also be impregnated with catalytic metals, such as Pt, Pd, Rh, Cu, Ni, Co, Ag, Mo, W, V, La or combinations thereof or other materials known to enhance catalytic activity.

Figure 3:
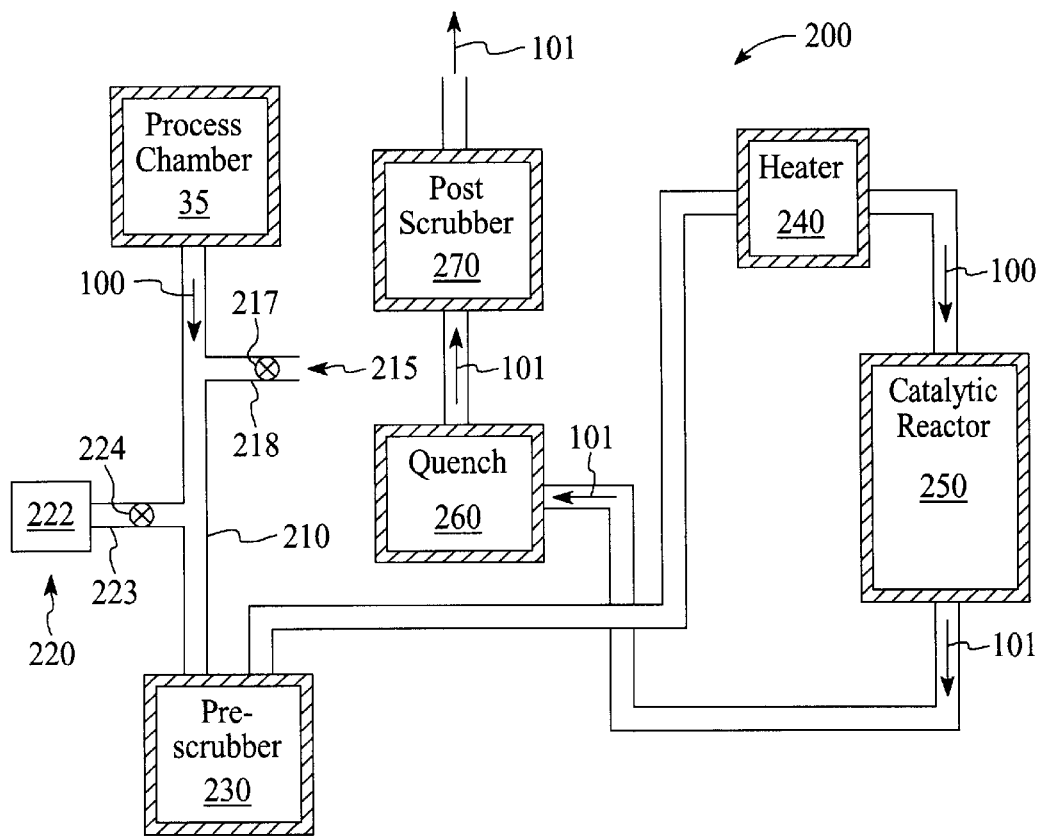
FIG. 3 is a schematic of a version of an abatement system with a catalytic reactor.

In one version, the catalytic reactor 250 is part of a catalytic abatement system 200. One version of the catalytic abatement system is shown in FIG. 3. A conduit 210 is sealingly engaged to the exhaust system 80 of chamber 35 so that effluent gas 100 comprising hazardous PFC gases from process chamber 35 flows into conduit 210. The conduit 210 delivers the effluent 100 through the catalytic abatement system 200. The catalytic abatement system may comprise, in general, one or more of a flow regulating system 215, an additive gas supply 220, a prescrubber 230, a heater 240, a catalytic reactor 250, a cooling system 260 and a postscrubber 270.

The flow regulating system 215 comprises a valve 217 on an inlet tube 218 in communication with the conduit 210 to allow air or other non-reactive gases to be introduced into the effluent stream 100 and to allow adjustment of the pressure within the conduit 210. Appropriate additive gases, such as $H_2O$ and $O_2$, may be introduced into the effluent 100 by any one of the flow regulating system 215, the additive gas supply 220, and/or the prescrubber 230. For example, a suitable additive gas supply 220 includes a tube 223 for communicating additive gas or fluid from a gas source 222 to the conduit 210 under the control of a valve 224.

Additives that react with the hazardous gases in the effluent 100 to abate the hazardous gases are added. For example, in one version, $F_2$ is chemically broken down by adding $H_2O$ to the effluent 100 in a volumetric concentration of from about 0.2% to about 20%, preferably from about 3.5% to about 10%, and more preferably from about 4% to about 5%. Other additive gases, such as oxygen, may also be added to the effluent either as $O_2$ or by adding air or other additives that release oxygen containing species or compounds in the hazardous gas. Alternatively or additionally, a non-reactive gas such as $N_2$ can be added, for example as a purge gas to purge the system.

A scrubber or prescrubber 230 is provided to add the additives in conjunction with or as an alternative to the additive gas supply 220. The prescrubber 230 may also be used to treat the effluent 100 before it is introduced into the catalytic reactor 250 to remove gaseous or particulate components of the effluent 100 that can damage the catalytic reactor 250 or make it less effective. For example, when $SiF_4$ is present in the effluent 100, the $SiF_4$ can potentially deactivate the catalyst or form deposits on the catalyst by breaking up in the presence of moisture and depositing silicon. The $SiF_4$ vapor is often generated, for example, during etching and cleaning processes in the chamber 35. The prescrubber 230 reacts $SiF_4$ with a scrubbing fluid, for example water, to reduce the content thereof in the effluent 100. It is believed that water reacts with the $SiF_4$ vapor as follows:

$$2H_2O + SiF_4 \rightarrow SiO_2 + 4HF$$

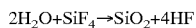

The resultant $SiO_2$ and HF products are more easily removable from the effluent 100. The HF may be dissolved in water and the $SiO_2$ may be removed by filtering. The removal of $SiF_4$ extends the life of the catalytic material in the catalytic reactor 250. Preferably, the size and process conditions in the prescrubber 230 are selected to remove substantially all of the $SiF_4$ from the effluent. One version of a prescrubber 230 is disclosed in U.S. patent application Ser. No. 09/435,119, filed on Nov. 5, 1999 and entitled "Process Gas Effluent Scrubber," which is incorporated herein by reference in its entirety. The prescrubber 230 may also allow $H_2O$ or other such additive gases to be added to the effluent 100 in sufficient quantities to complete the hazardous gas reaction in the catalytic reactor 250. When the system is used to abate effluent 100 that does not contain significant quantities of catalyst contaminants such as $SiF_4$, the prescrubber 230 may be removed from the system.

Downstream, a heating system, for example a heater 240 and/or a cross flow heat exchanger (not shown), optionally heats the effluent 100 and additives within conduit 210 to temperatures sufficient to promote the catalytic reaction and abate the hazardous gases in the catalytic reactor 250. The effluent 100 is passed through the catalytic reactor 250 to abate the content of hazardous gases in the effluent. If the effluent 100 is heated, the abated effluent 101 may also be cooled before it is scrubbed and exhausted. In one version, the cooling system 260 comprises a fluid cooling system such as a cold water quenching system that sprays cold water to cool the abated effluent 101. The abated effluent 101 is then introduced into a scrubber 270 having a reactor where the acidic materials in the abated effluent 101 are dissolved in a solvent, such as for example water, to form an acidic solution that is more easily exhausted or disposed. Although heating the $F_2$ containing effluent is not required to reduce the $F_2$ concentration in the catalytic reactor, it has been further discovered that heat improves the abatement efficiency and extends the life of the catalyst. Temperatures at or less than about 700° C., or in the range from about 50° C. to about 300° C., depending on the composition and concentration of the effluent 100 have been discovered to be particularly effective.

It should be noted that HF is produced both in the prescrubber 230 and in the catalytic reactor 250. The presence of HF in the effluents 100,101 may pose safety concerns and handling difficulties because HF is toxic and should not come into contact with skin. Additionally, HF is highly corrosive, particularly at elevated temperatures and in the presence of moisture and oxygen. It has been discovered that nickel-based alloys, for example Inconel 600 or 625 (TM) available from Inco Corporation in Huntington, W. Va, provide excellent corrosion resistance in the catalytic abatement system 200 environment and may be reliably sealable and gas tight to prevent unwanted HF escape from the system. Additionally, this system provides sufficiently sealed system protecting against $OF_2$ if any $OF_2$ is formed between the prescrubber 230 and the catalytic reactor 250. It is believed that if any $OF_2$ is formed before the catalysis reactor 250, the catalytic reactor encourages the breakdown of the $OF_2$ and the subsequent formation of HF and $O_2$. It has been determined from gas analysis that the abated effluent 101 is absent dangerous levels of $OF_2$.

Figure 4:
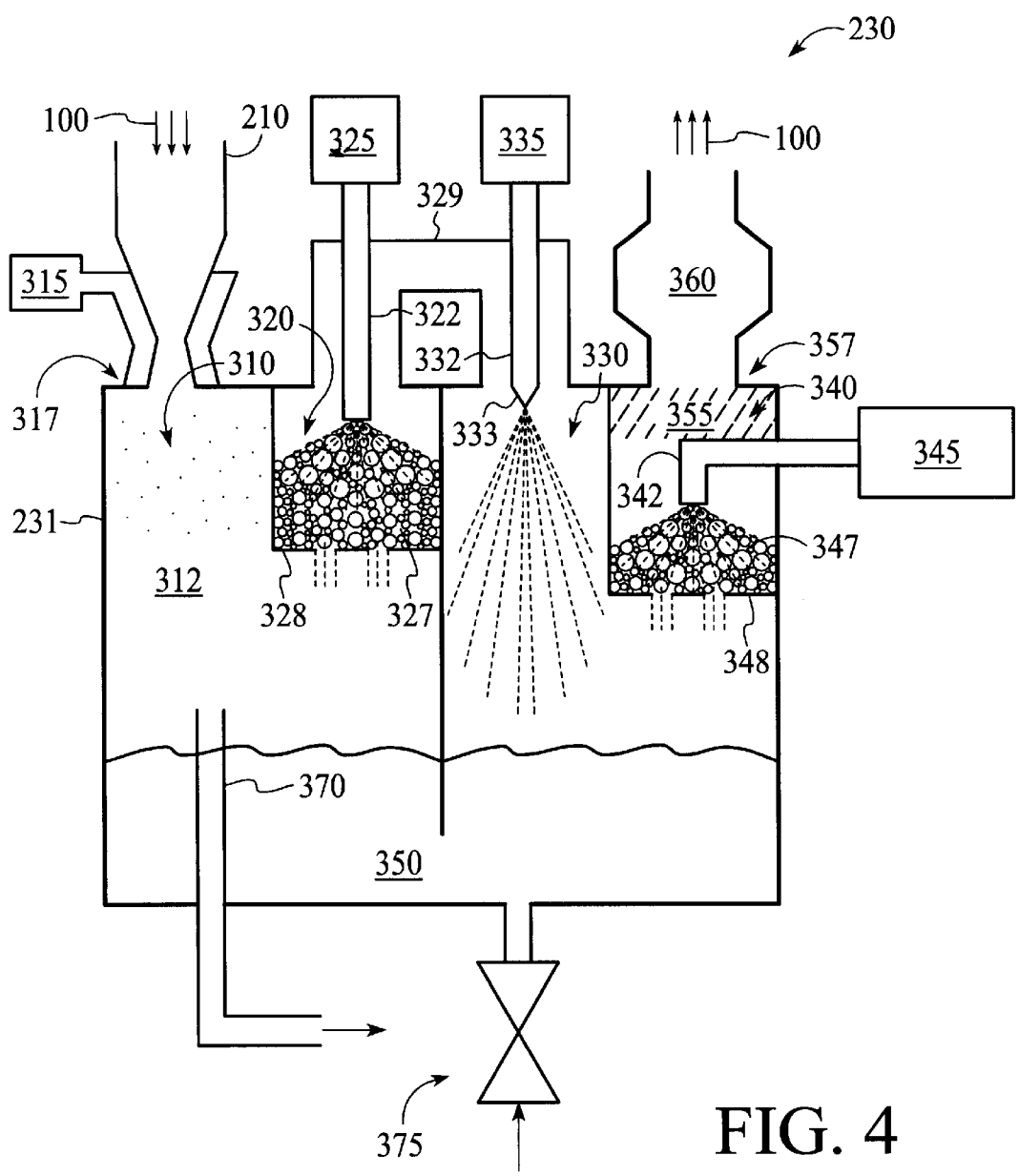
FIG. 4 is a schematic sectional side view of a version of a prescrubber usable with an abatement system.

It has been discovered that it may be desirable to introduce a high percentage of water into the $F_2$ containing effluent 100. An exemplary prescrubber for adding $H_2O$ to $F_2$ containing effluent is shown in FIG. 4. The prescrubber 230 includes a reactor 231 for receiving the $F_2$ (and potentially $SiF_4$) containing effluent 100 and reacting the effluent 100 with a scrubbing fluid, such as water. A hydrolyzer column or channel 310 receives effluent 100 from the conduit 210. The effluent 100 may have been previously mixed with an additive, as discussed above. The hydrolyzer column 310 presents a hydrolytic or humid environment 312 to the effluent 100. This initial exposure to moisture, or other scrubbing fluid, begins the breakdown of the desired component in the effluent 100, for example $SiF_4$. The hydrolyzer column 310 allows for the removal of large scrubbed particles before these large scrubbed particles can clog or deposit in subsequent columns in the prescrubber 230. The combination of the initial moisture exposure, the substantially vertical nature of the column and the downward flow of effluent 100 allows for the removal of these large particles. A hydrolyzer column or channel downstream of a scrubbing fluid dispenser or other direct source of scrubbing fluid would not be effective at removing a substantial amount of, for example, $SiF_4$. A purge gas supply 315 may be provided at or near an inlet 317 to introduce a purge gas, for example air, $O_2$, or $N_2$, to purge the system and/or to prevent upstream hydrolyzation. The inlet may be of a venturi type.

The effluent 100 then passes through a first scrubber column or channel 320. A nozzle 322 dispenses scrubbing fluid, for example water, from a source 325 into the stream of effluent 100. In one version, as shown, the fluid dispensing is done by spraying water is in a direction which is countercurrent to the flow of gas. By "countercurrent" it is meant that at least a portion of the flow is in a direction substantially opposing the general direction of the flow of the gas. This arrangement allows for gravity and the flow of water to encourage transport of reactant products, for example silicon dioxide particles and HF, into a reservoir 350. Column 320 may optionally be provided with surface area increasing material 327, for example plastic or ceramic pellets or granules of differing sizes, such as for example PVC balls, for increasing the surface area of water/gas contact in the column and thereby encouraging $SiF_4$ destruction reactions. A platform 328 that is readily permeable to the effluent 100 and the reaction products but impermeable to the surface area increasing material 327 may be provided to contain the surface area increasing material 327 within the first column 320.

Figure 5:
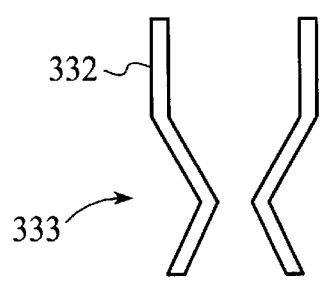
FIG. 5 is a schematic sectional side view of an exemplary version of a venturi tube and venturi nozzle usable with a prescrubber.

The effluent 100 then flows though a conduit 329 to a venturi column or channel 330. A venturi tube 332 dispenses fluid, for example water, from a source 335 into the column 330. A venturi nozzle 333 is located at the end of the venturi tube 332 to inject the water into the venturi column. By "venturi" it is meant a tube with a constricted, throatlike passage that increases the velocity and lowers the pressure of a fluid conveyed through it. By "inject" it is meant that the scrubbing fluid is dispensed through a "venturi." The venturi 332, 333 of the present invention provides a constriction with a small opening that breaks the water down into small droplets. In one version, the opening of the venturi nozzle is sized from about 0.1 inch to about 1.4 inches, more preferably from about 0.25 inches to about 1.25 inches, and most preferably from about 0.5 inches to about 1 inch for a tube 332 having a 1.5 inch diameter. In the version shown, the flow of water is in the direction of the flow of effluent 100. The venturi column 330 serves to (i) further scrub the effluent by increasing the surface area of water/gas contact by the generation of the droplets, (ii) further transport reaction products to the reservoir 350 by the high speed bombardment of water from the venturi nozzle 333, (iii) provide the additive $H_2O$ for destroying PFC's, as discussed above, in the catalytic reactor 250, and (iv) generate negative pressure and thereby effectively supply positive pressure to the effluent 100 to compensate for pressure drops through the prescrubber 230. The resulting net pressure drop through the prescrubber 230 is approximately zero. Optionally, a pressure gain can even be generated. FIG. 5 shows an exemplary version of the venturi tube 332 and venturi nozzle which is not intended to limit the invention. For example, the relative sizes and angles of the tube and the opening of the constriction can be modified to adjust or optimize the flow for a desired purpose.

Referring again to FIG. 4, a second scrubber column or channel 340 receives the effluent from the venturi column 330. The second scrubber column may include a second spray nozzle 342 for dispensing scrubbing fluid, for example by spraying water, from a source 345 countercurrently into the effluent 100. The second scrubber column 340 may further have surface area increasing material 347 contained on platform 348 which may be similar to surface area increasing material 327 and platform 328 of the first scrubbing column 320. The second scrubbing column 340 provides yet another level of scrubbing the effluent 100 and further serves to transport the reaction products to the reservoir 350. A mist eliminator 355 may be positioned near outlet 357 to remove water droplets from the effluent 100. While about 4% to about 5% percent moisture content in the effluent 100 is desired for catalytic treatment, droplets are not desired because they can carry scrubbing product particles that can contaminate the catalyst within the catalytic reactor 250. The mist eliminator 355 removes the droplets, but passes the desired moisture. Mist eliminator 355 may comprise, for example, packed material or a mesh such as a wire mesh.

The prescrubber 230 may be designed in one version so that a sufficient amount of water and/or pressure is introduced into the effluent 100 to make the $H_2O$ content of the effluent 100 from about 4 to about 5 percent. Each column or channel 310, 320, 330, 340 is designed for about 80 percent to about 90 percent destruction of $SiF_4$. Therefore, if two columns were provided and the effluent 100 passed through two columns, from about 96 percent to about 99 percent of the $SiF_4$ would be removed. Passage through three columns provides from about 99.2 percent to about 99.9 percent removal. Passage through all four columns provides from about 99.8 percent to about 99.99 percent removal. Qualitative measurements carried out by EPA Method 5 "Determination of Particulate Emissions from Stationary Sources " techniques indicates consistent $SiF_4$ removal efficiency of 99.97 percent or better. Particle measurement determinations indicate that about 80 percent of the particles in the treated effluent 100 range in size from about 1 to about 2.5 $\mu$m. Therefore, another level of particle removal may be provided by filter 360, for example a hepa filter, which may be positioned near outlet 357. The hepa filter 360 removes a substantial amount of the reaction product particles that have not been transported into the reservoir 350. The hepa filter 360 is effective for filtering particles greater than about 0.3 $\mu$m and is therefore ideal for removing these reaction product particles. It should be appreciated that the prescrubber 230 may be provided with any number of columns. Furthermore, it should be appreciated that the "columns" need not necessarily be vertically oriented, but may be channels oriented horizontally, vertically or at any orientation therebetween. Furthermore, the channels need not be parallel. Adjacent channels may be angularly oriented at any angle from zero degrees (i.e., substantially parallel and with the effluent flow 100 in opposite directions, as shown in FIG. 4) to 180 degrees (i.e., parallel and with the effluent flow in the same direction). In one arrangement, the channels have a relative orientation of less than 90 degrees. An overflow drain 370 and a filling unit 375 maintain the reservoir 350 at a desired level.

Figure 6:
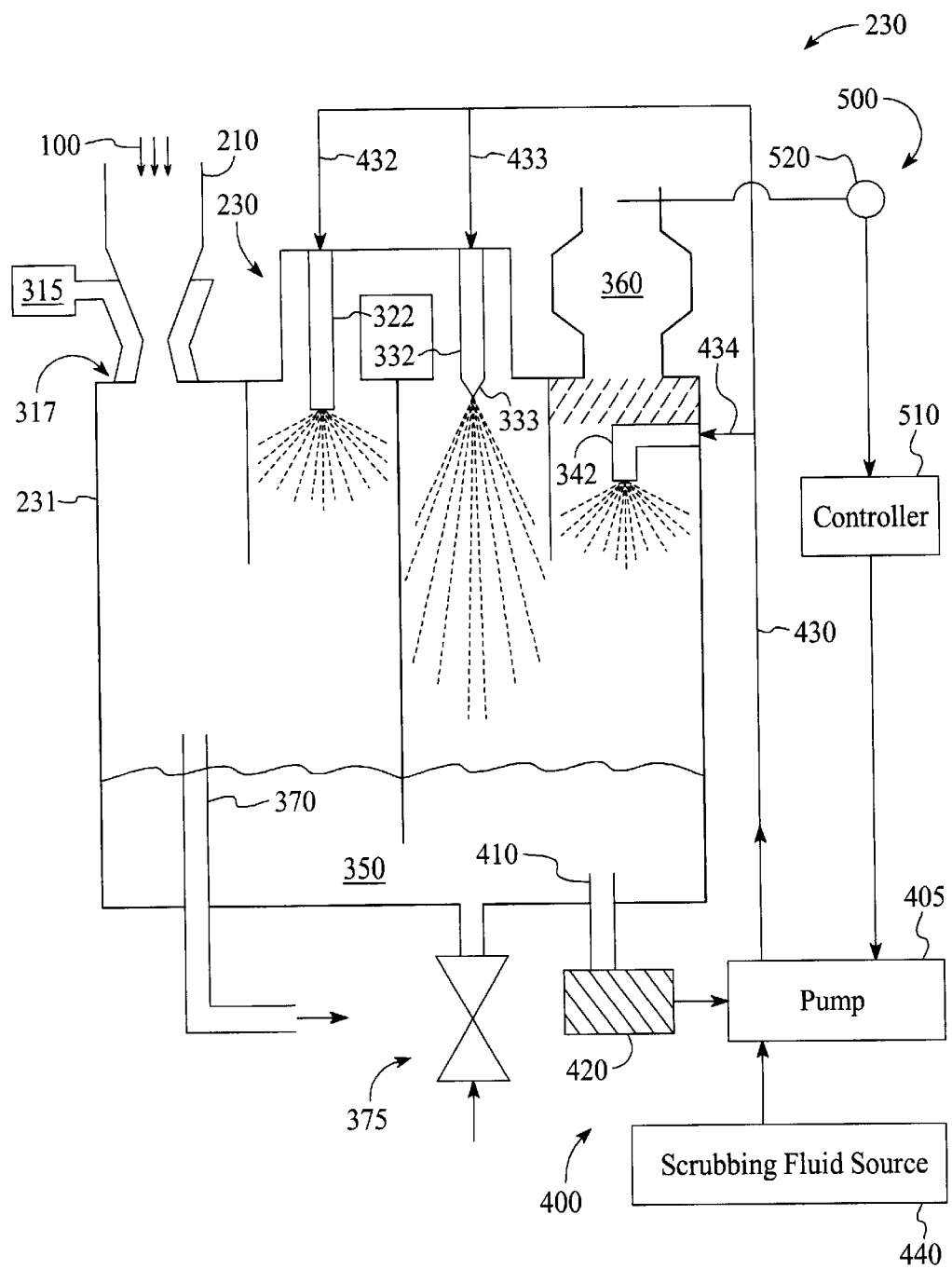
FIG. 6 is a schematic sectional side view of a version of a prescrubber with a scrubbing fluid recirculation system.

Another version of the prescrubber 230 is shown in FIG. 6. In this version a recirculation system 400 recirculates the scrubbing fluid, for example water with reaction products, through the prescrubber 230. The reservoir 350 is first filled to a desired level by filling unit 375 which is connected to a source of scrubbing fluid, for example a water source. The desired level corresponds with a height of overflow drain 370. Pump 405 is then turned on. Pump 405 withdraws fluid from reservoir 350. In the version shown, the fluid in the reservoir is a mixture of water and scrubber reaction products such as silicon dioxide and HF. The fluid passes through outlet 410 under the influence of negative pressure generated by the pump 405 and through particulate filter 420 which removes reaction product particles. Particulate filter 420 may comprise filter which is capable of removing particles above from about 2 microns to about 1 mm in diameter. In one version, the particulate filter 420 removes particles sized greater than about 70 microns. The filtered fluid is then pumped via line 430 to fluid nozzles 322, 342 and to venturi tube 332 by lines 432, 434, 433, respectively. The pump 405 also withdraws fresh scrubbing fluid, water in the version shown, from a scrubbing fluid source 440 (i.e., a water source) at a predetermined rate. The addition of fresh water results in an overflow of reservoir 350 into overflow drain 370 which transports the overflow to an acid drain. The addition of fresh water allows for the maintenance of a predetermined or adjustable pH of reservoir 350. In one version, fresh water is introduced at a rate of from about 0.25 gallons per minute to about 1 gallon per minute. In one version, fresh water is introduced at about 0.5 gallons per minute, or at a rate sufficient to maintain the pH of the scrubbing fluid at a level of about 2 to about 3. Alternatively, a pH meter can be provided and a controller can adjust the amount of fresh water introduced in accordance with the measured pH.

A control system 500 including a programmable controller 510 may be provided to control the operation of the pump 405. The controller 510, which may be in the form of a central processing unit (CPU), operates the pump 405 in accordance with a set of programmed instructions designed to introduce a predetermined amount of water into the effluent 100. For example, when $F_2$ containing effluent 100 is to be abated, the pumping rate necessary to provide greater than about 2% or from about 2% to about 20% or from about 4% to about 5% water concentration in the effluent 100 can be selected (as empirically determined). In another version, a gas analyzer 520 may be provided at the outlet of the prescrubber 230. The controller 510 can be responsive to the output signal from the analyzer 520 and can adjust the operation of the pump 405 in accordance with the output signal to maintain the water concentration at a predetermined level. For example, when the percentage of moisture, or other additive gas, falls below a predetermined level, as determined by analyzer 520, the controller 510 can automatically adjust the operating speed or the fresh water intake of the pump 405. Alternatively, a gas analyzer (not shown) can be located downstream of the catalytic reactor 250, and the controller 510 can be responsive to an $F_2$ concentration signal from the gas analyzer. For example, the amount of water introduced into the effluent 100 can be increased when the $F_2$ concentration exceeds a predetermined level.

The controller 510 comprises a computer readable medium having computer readable program code embodied therein that monitors the output signal(s) from the gas analyzer 520. The controller 510 may be incorporated into a system controller, such as the system controller described in U.S. patent application Ser. No. 09/363,302, filed on Jul. 28, 1999, and entitled "Treatment of Process Gas Effluent," which is incorporated herein by reference in its entirety. The controller 510 may comprise a computer program code product that controls a computer comprising one or more central processor units (CPUs) interconnected to a memory system with peripheral control components, such as for example, a PENTIUM microprocessor, commercially available from Intel Corporation, Santa Clara, Calif. The CPUs of the controller 510 can also comprise ASIC (application specific integrated circuits) that operate a particular component of the system. An interface between an operator and the controller 510 may be a CRT monitor and a light with a light sensor in the tip of the pen. To select a particular screen or function, the operator touches a designated area of the CRT monitor and pushes a button on the pen. The area touched changes its color or a new menu or screen is displayed to confirm the communication between the light pen and the CRT monitor. Other devices, such as a keyboard, mouse or pointing communication device can also be used to communicate with the controller 510. An operator may be able thereby to input ranges of pH values or flow rates of the scrubbing fluid.

The computer program code operating the CPU(s) and other devices of the computer can be written in any conventional computer readable programming language, such as for example, assembly language, C, C++, or Pascal. Suitable program code is entered into a single file, or multiple files, using a conventional text editor and stored or embodied in a computer-usable medium, such as a memory system of the computer. If the entered code text is in a high level language, the code is compiled to a compiler code which is linked with an object code of precompiled windows library routines. To execute the linked and compiled object code, the system user invokes the object code, causing the computer to load the code in memory to perform the tasks identified in the computer program. The software may include code to evaluate the pH of the scrubbing fluid and to accordingly adjust the amount of fresh water added to the scrubbing fluid, for example.

The $F_2$ catalytic abatement system 200 may be a self-contained and integrated unit that is compatible with various process chambers 25. The catalytic abatement system 200 can be used to destroy a large variety of hazardous gases, including substantially all types of PFCs. The catalytic abatement system 200 has no impact on process chamber 25 operation and may be used with any process chamber that exhausts hazardous gases. The catalytic abatement system is convenient to handle and occupies less than 40 cubic feet.

Although the present invention has been described in considerable detail with regard to certain preferred versions thereof, other versions are possible. For example, the described system could be used to abate other undesirable gases from the effluent. Therefore, the appended claims should not be limited to the description of the preferred versions contained herein.

What is claimed is:

1. A method of forming and treating an effluent gas from a process chamber, the method comprising:

before, during, or after processing a substrate in the process chamber, introducing a process gas into the process chamber and forming an effluent gas comprising $F_2$ gas;

introducing an additive comprising $H_2O$ into the effluent gas; and passing the resulting effluent gas over a catalyst and thereby reducing the content of the $F_2$ gas in the effluent gas.

2. A method according to claim 1 comprising setting process conditions in the process chamber so that the effluent gas generated has an $F_2$ concentration of at least about 10%.

3. A method according to claim 1 wherein the volume percent of additive in the effluent gas is greater than about 2%.

4. A method according to claim 1 further comprising the step of scrubbing the effluent gas before passing the effluent gas over the catalyst and wherein the additive is introduced while scrubbing the effluent gas.

5. A method according to claim 1 wherein the additive is introduced into the effluent gas from an additive gas source.

6. A method according to claim 1 further comprising the step of scrubbing the effluent gas before passing the effluent gas over the catalyst.

7. A method according to claim 1 comprising introducing the additive into the effluent gas after passing the effluent gas over the catalyst.

8. A method according to claim 7 wherein the additive comprises an acid dissolving additive.

9. A method according to claim 1 comprising passing the effluent over a catalyst comprising a ceramic impregnated with a metal.

10. A method according to claim 9 wherein the ceramic comprises one or more of $Al_2O_3$, $ZrO_2$, and $TiO_2$.

11. A method according to claim 10 wherein the metal comprises one or more of Pt, Pd, Rh, Cu, Ni, Co, Ag, Mo, W, V, and La.

12. A method according to claim 1 wherein after the processing of the substrate, the process gas is introduced for conducting a chamber cleaning process.

13. A method of forming and treating an effluent gas from a process chamber, the method comprising:

before, during, or after processing a substrate in the process chamber, introducing a process gas into the process chamber and forming an effluent gas comprising $F_2$ gas;

introducing an additive into the effluent gas, the additive comprising a hydrogen species and an oxygen species; and passing the resulting effluent gas over a catalyst, thereby reducing the content of the $F_2$ gas in the effluent.

14. A method according to claim 13 comprising setting process conditions in the process chamber so that the effluent gas generated has an $F_2$ concentration of at least about 10%.

15. A method according to claim 13 wherein the volume percent of additive in the effluent gas is greater than about 2%.

16. A method according to claim 13 wherein the additive comprises $H_2O$.

17. A method according to claim 13 wherein the additive comprises hydroxy species.

18. A method of forming and treating an effluent gas from a process chamber, the method comprising:

before, during, or after processing a substrate in the process chamber, introducing a process gas into the process chamber and forming an effluent gas comprising $F_2$ gas;

heating the effluent gas; and passing the effluent gas over a catalyst, thereby reducing the content of the $F_2$ gas in the effluent.

19. A method according to claim 18 comprising setting process conditions in the process chamber so that the effluent gas generated has an $F_2$ concentration of at least about 10%.

20. A method according to claim 18 further comprising introducing an additive into the effluent gas, the additive comprising a hydrogen species and an oxygen species.

21. A method according to claim 20 wherein the volume percent of additive in the effluent gas is greater than about 2%.

22. A method according to claim 18 wherein the additive comprises $H_2O$.

23. A method of cleaning a process chamber, the method comprising:

(a) introducing a cleaning gas into the process chamber and forming an effluent gas comprising $F_2$;

(b) introducing an additive into the effluent gas; and (c) after (b), passing the effluent gas over a catalyst, thereby reducing the content of the $F_2$ gas in the effluent.

24. A method according to claim 23 wherein the cleaning gas comprises $NF_3$.

25. A method according to claim 23 further comprising energizing the cleaning gas in a remote chamber.

26. A method according to claim 23 wherein the additive comprises a hydrogen species and an oxygen species.

27. A method according to claim 26 wherein the volume percent of additive in the effluent gas is greater than about 2%.

28. A method according to claim 26 wherein the additive comprises $H_2O$.

29. A method of forming and treating an effluent gas from a process chamber, the method comprising:

introducing a process gas into the process chamber to process a substrate or clean the process chamber;

forming an effluent gas comprising $F_2$;

introducing an additive into the effluent gas, the additive comprising a hydrogen species and an oxygen species;

passing the resulting effluent gas over a catalyst, thereby forming HF; and introducing $H_2O$ into the effluent gas to dissolve the HF.

30. A method according to claim 29 wherein the process gas comprises a cleaning gas comprising $NF_3$.

31. A method according to claim 30 further comprising energizing the cleaning gas in a remote chamber.

32. A method according to claim 29 further comprising energizing the process gas in a remote chamber.

33. A method according to claim 29 wherein the additive comprises $H_2O$.

34. A method according to claim 29 comprising passing the effluent gas over a catalyst comprising a ceramic impregnated with a metal.

35. A method according to claim 34 wherein the ceramic comprises one or more of $Al_2O_3$, $ZrO_2$, and $TiO_2$.

36. A method according to claim 35 wherein the metal comprises one or more of Pt, Pd, Rh, Cu, Ni, Co, Ag, Mo, W, V, and La.

* * * * *